United States Patent
Gridelet et al.

(10) Patent No.: US 9,111,987 B2
(45) Date of Patent: Aug. 18, 2015

(54) METHOD OF MANUFACTURING A BIPOLAR TRANSISTOR, BIPOLAR TRANSISTOR AND INTEGRATED CIRCUIT

(71) Applicant: NXP B.V., Eindhoven (NL)

(72) Inventors: Evelyne Gridelet, Omal (BE); Johannes Donkers, Valkenswaard (NL); Petrus Hubertus Cornelis Magnee, Nijmegen (NL); Viet Dinh, Leuven (BE); Tony Vanhoucke, Bierbeek (BE)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/259,550

(22) Filed: Apr. 23, 2014

(65) Prior Publication Data

US 2014/0327110 A1 Nov. 6, 2014

(30) Foreign Application Priority Data

May 1, 2013 (EP) .................................... 13166124

(51) Int. Cl.
| | |
|---|---|
| *H01L 21/331* | (2006.01) |
| *H01L 27/082* | (2006.01) |
| *H01L 29/70* | (2006.01) |
| *H01L 29/732* | (2006.01) |
| *H01L 29/40* | (2006.01) |
| *H01L 29/66* | (2006.01) |
| *H01L 29/737* | (2006.01) |

(52) U.S. Cl.
CPC ............ *H01L 29/732* (2013.01); *H01L 29/407* (2013.01); *H01L 29/66242* (2013.01); *H01L 29/66272* (2013.01); *H01L 29/7378* (2013.01)

(58) Field of Classification Search
CPC .............. H01L 29/7813; H01L 29/402; H01L 29/1095; H01L 29/407; H01L 29/7395; H01L 29/732
USPC .......... 257/565, 571, 575, 586, 587; 438/309, 438/316, 322, 338, 342, 353
See application file for complete search history.

(56) References Cited

U.S. PATENT DOCUMENTS

| | | | |
|---|---|---|---|
| 7,132,344 | B1 | 11/2006 | Knorr |
| 8,026,146 | B2 | 9/2011 | Donkers et al. |
| 2008/0265329 | A1* | 10/2008 | Hirler et al. ................... 257/367 |

(Continued)

FOREIGN PATENT DOCUMENTS

EP 2 466 628 A1 6/2012

OTHER PUBLICATIONS

Hueting, R. et al. "A New Trench Bipolar Transistor for RF Applications", IEEE Transactions on Electron Devices, vol. 51, No. 7, pp. 1108-1113 (Jul. 2004).

(Continued)

*Primary Examiner* — Hsien Ming Lee

(57) ABSTRACT

Consistent with an example embodiment, a bipolar transistor comprises an emitter region vertically separated from a collector region in a substrate by a base region. The bipolar transistor further comprises a field plate electrically connected to the emitter region; the field plate extends from the emitter region along the base region into the collector region and the field plate is laterally electrically insulated from the base region and the collector region by a spacer. The spacer comprises an electrically isolating material that includes a silicon nitride layer and is vertically electrically isolated from the substrate by a further electrically isolating material.

14 Claims, 12 Drawing Sheets

(56) References Cited

U.S. PATENT DOCUMENTS

2009/0212394 A1    8/2009    Melai et al.
2012/0007176 A1    1/2012    Kadow et al.
2013/0087799 A1*   4/2013    Gridelet et al. ................. 257/66

OTHER PUBLICATIONS

Jain, S. et al. "Transient Enhanced Diffusion of Bron in Si", J. of Applied Physics, vol. 91, No. 11, p. 8919-8941 (Jun. 2002).

Rucker, H. et al. "Suppressed Diffusion of Boron and Carbon in Carbon-Rich Silicon", Appl. Phys. Lett., vol. 73, No. 12, pp. 1682-1684 (Sep. 1998).

Taur, Y. et al. "Fundamentals of Modern VLSI Devices, Basic Device Physics", Cambridge Univ. Press, pp. 90-95 (1998).

Extended European Search Report for EP Patent Appln. No. 13166124.1 (Sep. 13, 2013).

* cited by examiner (c)

(d)

METHOD OF MANUFACTURING A BIPOLAR TRANSISTOR, BIPOLAR TRANSISTOR AND INTEGRATED CIRCUIT

CROSS-REFERENCE TO RELATED APPLICATIONS

This application claims the priority under 35 U.S.C. §119 of European patent application no. 13166124.1, filed on May 1, 2013, the contents of which are incorporated by reference herein.

FIELD OF THE INVENTION

The present invention relates to a method of manufacturing a bipolar transistor having a field plate to create a RESURF effect in the depletion region.

The present invention further relates to a bipolar transistor having such a field plate.

The present invention yet further relates to an integrated circuit (IC) comprising such a bipolar transistor.

BACKGROUND OF THE INVENTION

Nowadays, many electronic devices incorporate functionality that operates at radio frequencies, such as mobile communication devices. The implementation of such functionality in a cost-effective manner is far from trivial. It is well-known that bipolar transistors are particularly suitable for handling signals in the radio frequency (RF) domain.

However, the manufacture of integrated circuits (ICs) based on silicon bipolar transistor technology is more costly than for instance complementary metal oxide semiconductor (CMOS) ICs, and the downscaling of the device feature size is more easily achieved in CMOS technology. The cost-effective nature of CMOS technology has led to the acceptance of CMOS technology as the mainstream technology of choice for the manufacture of a wide variety of semiconductor components including ICs.

Efforts have been made to produce bipolar transistors within a CMOS process flow, thereby providing mixed technology ICs in which bipolar transistors can be used for handling RF signals. Such process flows are sometimes referred to as BiCMOS technology. An example of a method of manufacturing a heterojunction bipolar transistor (HBT) in a BiCMOS manufacturing process is provided in EP 2 466 628 A1, in which the heterojunction bipolar transistor has a SiGe base (SiGe HBT).

Transistors suffer from the well-known Johnson limit. For a bipolar transistor, this limit equates to the product of peak current gain cut-off frequency $f_T$, which is the high-frequency figure of merit of the transistor, and the collector-emitter breakdown voltage $BV_{CEO}$. In other words, it is far from trivial to provide a bipolar transistor that can handle both high operating frequencies as well as high voltages. These characteristics are typically obtained by controlling the amount of doping in the collector. A high collector doping level on the one hand increases $f_T$ because it postpones the Kirk effect but on the other hand decreases $BV_{CEO}$ because it increases the local electric field, and thus the avalanche multiplication.

The high-frequency order of merit figure $f_T$, the collector-emitter breakdown voltage $BV_{CEO}$ and the collector-base junction breakdown voltage $BV_{CBO}$ of a bipolar transistor all depend of the collector doping $N_c$. The maximum of the $f_T$ curve is determined by the start of the Kirk effect, which occurs at a collector current density $J_k$. This is shown in FIG. 1, which demonstrates that the higher the doping concentration $N_c$, the higher $J_k$ and the peak value of $f_T$ become.

$BV_{CEO}$ is the voltage at which the hole-current generated by avalanche is sufficiently large to keep the emitter-base junction forward biased, such that a transistor current remains in the absence of an external base current. $BV_{CEO}$ therefore increases when the avalanche decreases. The avalanche effect is due to the acceleration of the electrons caused by a high electric field in the depletion region.

It is well-known that the small region surrounding the point of maximum electric field provides the largest contribution to the avalanche current. The depth of the depletion region over which the electric charges can be distributed is inversely related to the doping level $N_c$ in the collector. As shown in FIG. 2, a bipolar transistor having relatively low levels of doping in a collector 11 buried collector 20 causes the formation of a relatively large depletion region 15 at the interface between the collector 11 and a base 30, whereas a bipolar transistor having a relatively higher level of doping in a collector 11' causes the formation of a relatively confined depletion region 15' at the interface between the collector 11' and a base 30. Hence, at high doping levels, the depletion region 15' is condensed, which increases the maximum electric field and, consequentially, the avalanche current, thus lowering $BV_{CEO}$. Similarly, $BV_{CBO}$ scales with $1/N_c$ and is therefore higher at low collector doping.

One way to increase the product of $f_T*BV_{CEO}$, thereby overcoming the Johnson limit, is to apply a field plate along the collector to decrease the electric field and therefore postpone the onset of the avalanche phenomenon to a higher voltage. This is known as the reduced surface field (RESURF) effect, and is schematically depicted in FIG. 3. The RESURF effect extends the depletion region 15 at the interface between the base 30 and the collector 11 towards the highly-doped collector 20 by applying a suitable potential to the field plate or gate 50.

Raymond J. E. Hueting et al. in "A New Trench Bipolar Transistor for RF Applications" in IEEE Transactions on Electron Devices, Vol. 51(7), 2004, pages 1108-1113 disclose a theoretical model of a vertical trench SiGe HBT having a trench field plate connected to the emitter and a linearly graded doping profile in the collector drift region that demonstrates improved avalanche characteristics at higher voltages. The field plate is electrically isolated from a SiGe base and the collector by a 135 nm thick oxide layer. This article further shows in FIG. 6 that electrical connection of a field plate to the emitter instead of to the base gives a further improvement in the peak cut-off frequency $f_T$ of a HBT.

It is however far from trivial to manufacture such a device in a cost-effective manner, especially in a BiCMOS process.

SUMMARY OF THE INVENTION

The present invention seeks to provide a method of manufacturing a bipolar transistor having a field plate.

The present invention further seeks to provide a bipolar transistor having such a field plate.

In accordance with an aspect of the present invention, there is provided a bipolar transistor comprising an emitter region vertically separated from a collector region in a substrate by a base region, the bipolar transistor further comprising a field plate electrically connected to the emitter region, the field plate extending from the emitter region along the base region into the collector region, the field plate being laterally electrically insulated from the base region and the collector region by a spacer comprising of electrically isolating material comprising a silicon nitride layer and vertically electrically isolated from the substrate by a portion comprising a layer of a further electrically isolating material.

Such a bipolar transistor can be manufactured in a cost-effective manner and benefits from enhanced protection of the doping profile in the base region because of the silicon nitride in the spacer prevents excessive outdiffusion of the doping profile from the base region as will be explained in more detail later. This is particularly relevant if the base region comprises a silicon germanium layer including a boron doping, as boron impurities have a relatively high mobility. In this embodiment, the silicon nitride layer in the spacer preferably has a thickness of at least 10 nm as this effectively protects the base from excessive boron diffusion during its manufacturing as previously explained.

In an embodiment, the electrically isolating material is silicon nitride and the further electrically isolating material is silicon oxide.

In an embodiment, the spacer comprises a silicon oxide layer over the base region and the collector region and a silicon nitride layer over the silicon oxide layer.

The silicon oxide portion may have a thickness of at least 20 nm to ensure that the silicon oxide portion can withstand a potential difference of 10V between the emitter and the collector.

In an embodiment, the substrate further comprises a buried collector such that the collector region is located in between the base region and the buried collector, wherein the buried collector has a higher doping level than the collector region.

In an embodiment, the field plate is a vertical field plate that extends into the buried collector. In an alternative embodiment, the field plate is a lateral or horizontal field plate in which the lateral dimension of the field plate exceeds its vertical dimension.

The bipolar transistor of the present invention may be advantageously integrated in an integrated circuit (IC), such as an IC manufactured in CMOS technology. Such an IC has an improved suitability for use in high frequency (e.g. RF) application domains as well as high voltage application domains, e.g. power amplifiers or RF power amplifiers.

In accordance with another aspect of the present invention, there is provided a method of manufacturing a bipolar transistor, the method comprising providing a semiconductor substrate including a collector region; forming a base layer on the semiconductor substrate; forming an etch protect layer on a portion of the base layer defining an emitter region; forming a base contact layer over the etch protect layer and the first base layer; forming an electrically insulating layer over the base layer; etching an opening in the resultant structure formed after the formation of the electrically insulating layer, said opening comprising an emitter window portion exposing at least a part of the etch protect layer and a field plate trench portion adjacent to the emitter window portion extending through the base layer, the base contact layer and into the collector region; lining said opening with an electrically insulating material; exposing said emitter region; and filling the lined opening with an electrically conductive material.

The method of the present invention enables the formation of a field plate electrically connected and adjacent to an emitter without requiring additional masks, as the emitter window and the field plate trench are opened in a single etching step. This absence of additional mask makes possible to pattern the field plates extremely close to the base-collector junction, i.e., extremely close to the region of highest electric field, where the field plates are the most efficient. The substrate preferably is a silicon substrate.

In an embodiment, the substrate may further comprise a buried collector such that the collector region is located in between the base region and the buried collector, wherein the buried collector has a higher doping level than the collector region; and wherein the field plate has a vertical shape in which the field plate trench portion extends into the buried collector. Alternatively, the field plate may have a horizontal shape wherein the lateral dimension of the field plate exceeds the vertical dimension of the field plate. The vertical shape may be preferential to avoid that the current flows around a corner, which may generate a high electric field. The horizontal shape may be preferential to make it possible to have, on the same chip, devices with various gate lengths, where the $f_T$ and/or the $BV_{CEO}$ may be different.

In an embodiment, the step of forming an etch protect layer on said portion of the base layer comprises forming a silicon oxide sealing layer on said portion; and forming a silicon nitride etch protect layer on the silicon oxide sealing layer. The presence of the silicon oxide sealing layer below the silicon nitride etch protect layer seals defects that may be present in the silicon nitride etch protect layer, thereby protecting the underlying base layer. A layer of silicon oxide may also be present on top of the silicon nitride etch protect layer to improve the selectivity of the etch recipe used to form said opening with respect to the etch protect layer.

In an embodiment, the base layer is a boron-doped silicon germanium containing layer, wherein said lining step comprises forming spacers including a silicon nitride layer and a silicon oxide layer at least on the exposed vertical surfaces of the opening; and forming a silicon oxide lining at the bottom of the field plate trench portion. It has been found that the combination of the silicon nitride etch protect layer and the silicon nitride layer in the sidewall spacers effectively protects the boron-doped silicon germanium base layer from excessive diffusion of the boron impurities during the formation of the silicon oxide lining. Moreover, if the field plate trench portion extends into the buried collector, the impurities in the buried collector can promote the silicon oxide growth, in particular if the collector is doped with arsenic (As), thereby further reducing the duration of the silicon oxide lining formation step and thus further limiting the boron diffusion.

The silicon oxide lining may be formed by a thermal wet oxidation step. The silicon oxide sealing layer may be removed prior to forming said silicon oxide lining to protect the silicon oxide lining from exposure to etching chemistries that can damage the silicon oxide lining.

In an embodiment, said lining step further comprises forming silicon oxide-silicon nitride-silicon oxide (ONO for oxide-nitride-oxide) spacers on the vertical exposed surfaces the opening. The silicon oxide layer on the base and collector surfaces prevents that the silicon nitride is in direct contact with silicon, which can create defects during a high temperature step. The silicon nitride layer is included to protect the base from oxidation enhanced diffusion. The silicon oxide layer on the silicon nitride layer protects the silicon nitride from etching during a further etch step. The ONO layer stack forms the electrically insulating barrier between the collector and the vertical part of the field plate, as well as providing the electrical isolation between the emitter and the base contact layer and between the field plate and the base layer.

The silicon oxide lining may have any suitable thickness. In an embodiment, the silicon oxide lining has a thickness of at least 20 nm and the silicon nitride spacers have a thickness of at least 10 nm in the completed bipolar transistor. The nitride spacer thickness ensures that the base is protected against enhanced diffusion whereas the silicon oxide lining thickness ensures that the silicon oxide lining can withstand a potential difference of 10V between the emitter and the collector.

BRIEF DESCRIPTION OF THE DRAWINGS

Embodiments of the invention are described in more detail and by way of non-limiting examples with reference to the accompanying drawings, wherein.

DETAILED DESCRIPTION OF THE EMBODIMENTS

Figure 1:
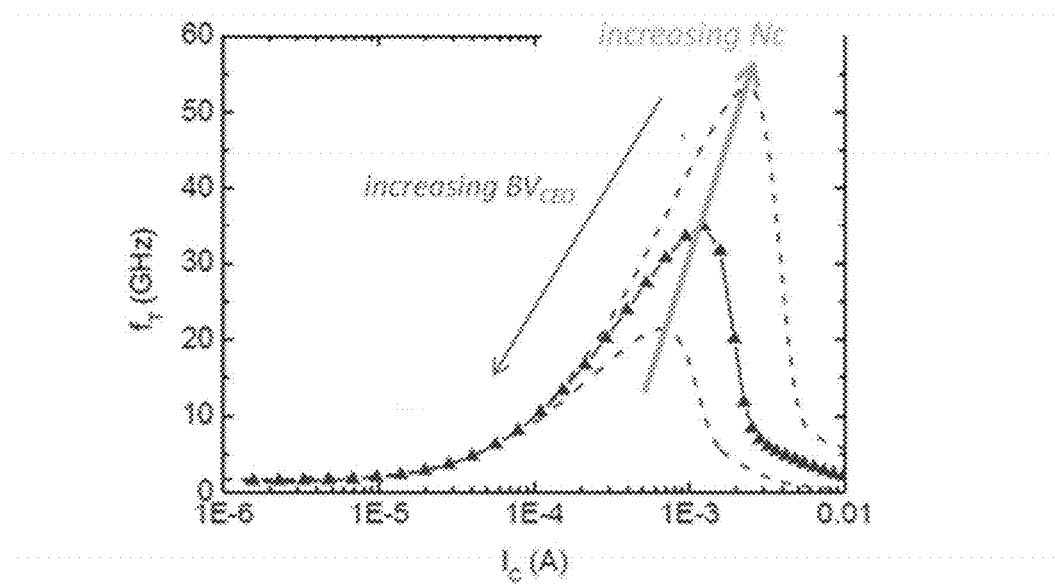
FIG. 1 schematically depicts the effect of collector doping levels on the current gain cut-off frequency $f_T$ of a bipolar transistor.
Figure 2:
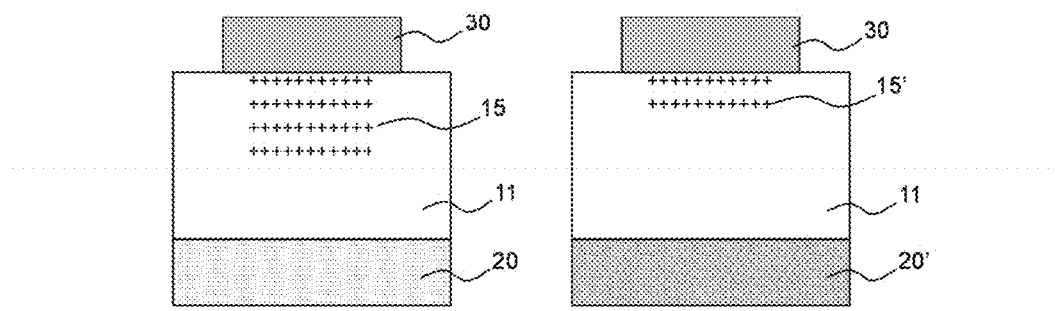
FIG. 2 schematically depicts the effect of collector doping levels on the depth of the depletion region formed in a bipolar transistor.
Figure 3:
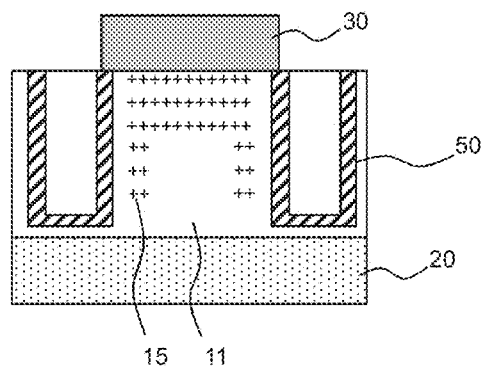
FIG. 3 schematically depicts the effect of a field plate on the shape of the depletion region formed in a bipolar transistor.

It should be understood that the Figures are merely schematic and are not drawn to scale. It should also be understood that the same reference numerals are used throughout the Figures to indicate the same or similar parts.

Figure 4:
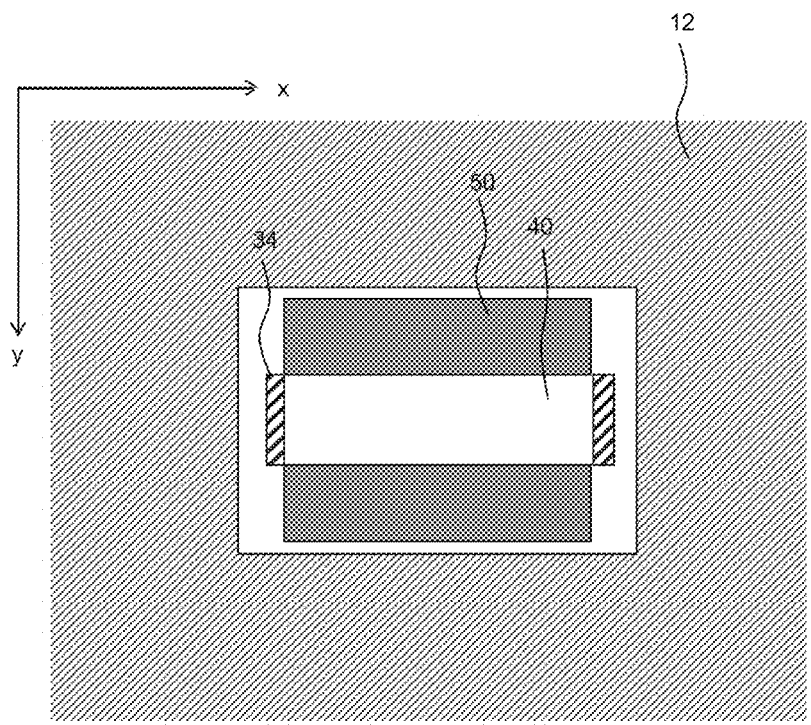
FIG. 4 schematically depicts a top view of a bipolar transistor according to an embodiment of the present invention.

FIG. 4 schematically depicts a top view of a bipolar transistor according to an embodiment of the present invention. Visible are an emitter region 40, field plates 50, an etch protect oxide layer 34 and an isolation region such as STI (shallow trench isolation) 12. A method of manufacturing such a bipolar transistor will be explained with the aid of FIG. 5(a)-(i) and FIG. 6 (a)-(i).

In the following embodiments, the collector region, the buried collector if present and the emitter of the bipolar transistor are doped with an impurity of a first conductivity type whereas the base is doped with an impurity of a second conductivity type, with the second conductivity type being different to the first conductivity type. For instance, the first conductivity type may be n-type, whereas the second conductivity type may be p-type. Alternatively, the first conductivity type may be p-type, whereas the second conductivity type may be n-type. The collector region and the buried collector may be formed in a substrate of the same conductivity type as the collector, e.g. an n-type collector may be formed in an n-type substrate, such as an n-type silicon substrate. The buried collector typically has a higher doping level than the collector region.

Although the present invention may be applied to any bipolar transistor design, the present invention will be explained by way of non-limiting example for a heterojunction bipolar transistor produced in a CMOS process with additional process steps for forming the bipolar transistor, i.e. a BiCMOS process, and having an n-type collector and emitter and a p-type base. It should be understood that different types of bipolar transistors, e.g. having a p-type collector and emitter and an n-type base are also feasible.

Figure 5:
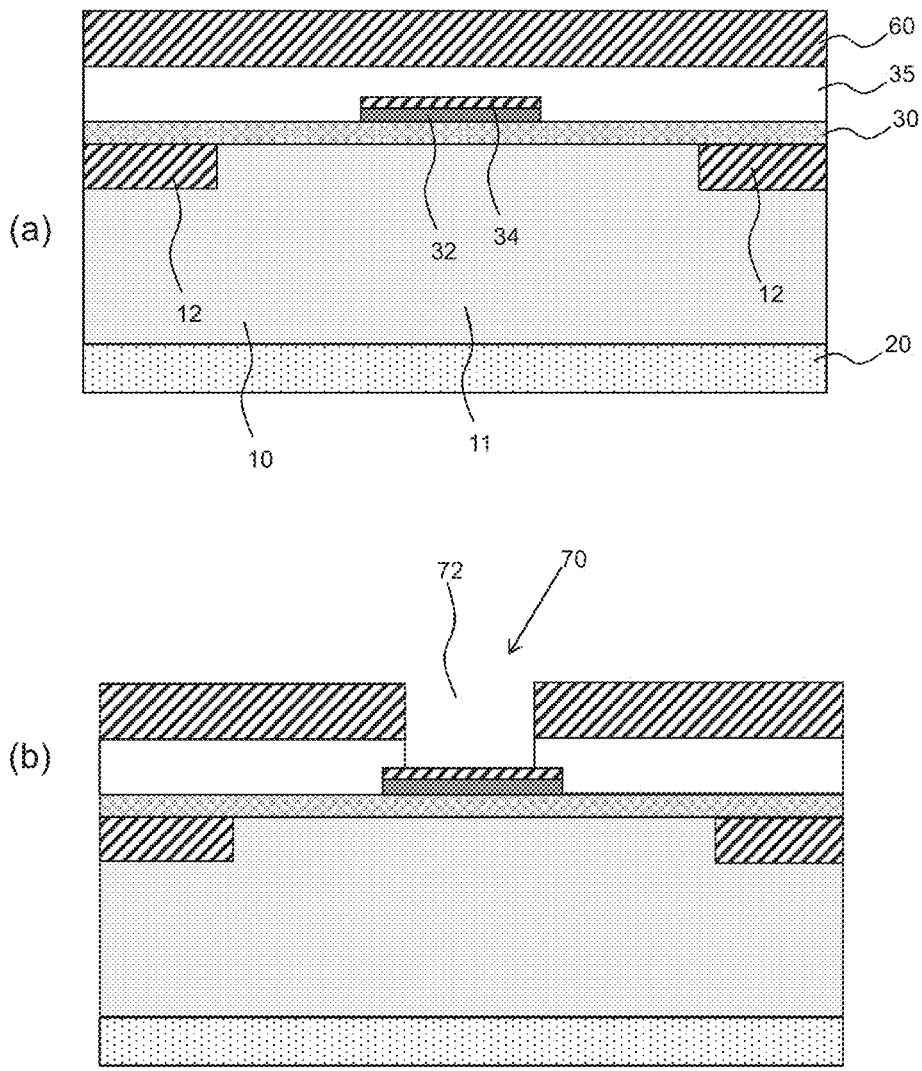
FIG. 5 schematically depicts the various steps of a method of manufacturing a bipolar transistor according to an embodiment of the present invention with views along the x-direction.
Figure 5:
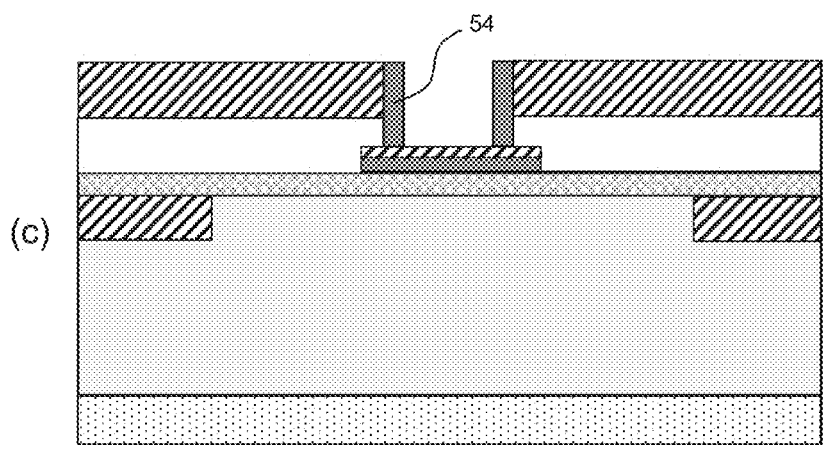
Figure 5:
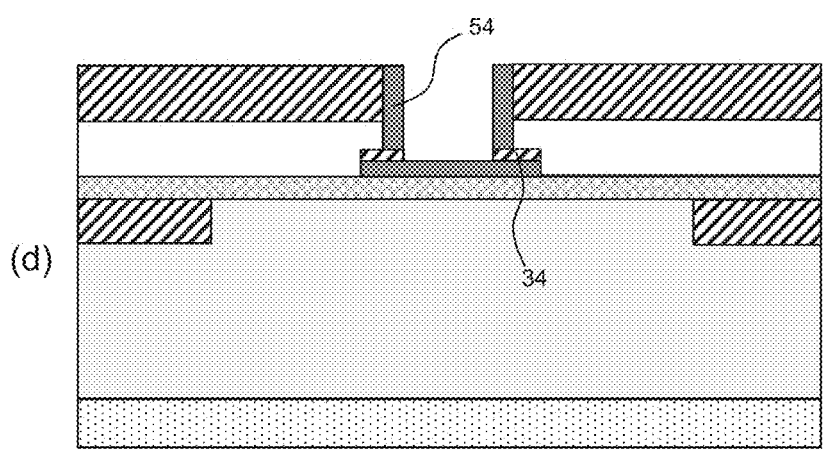
Figure 5:
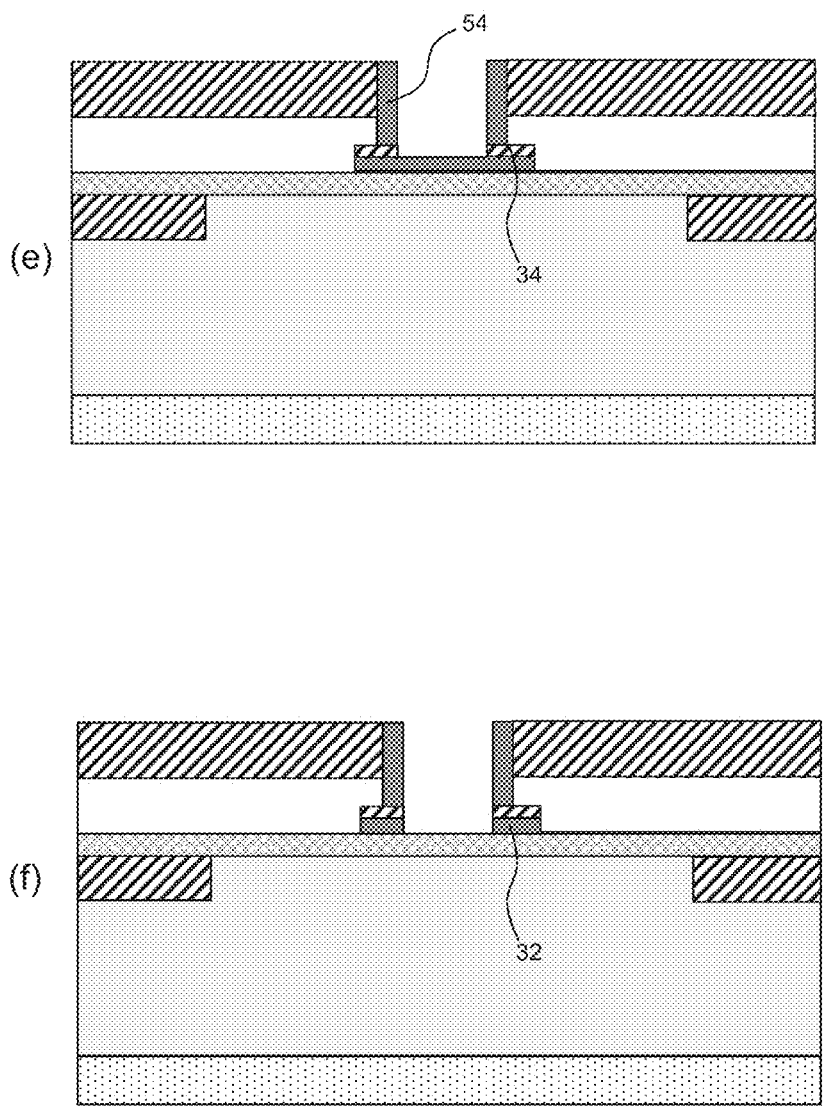
Figure 5:
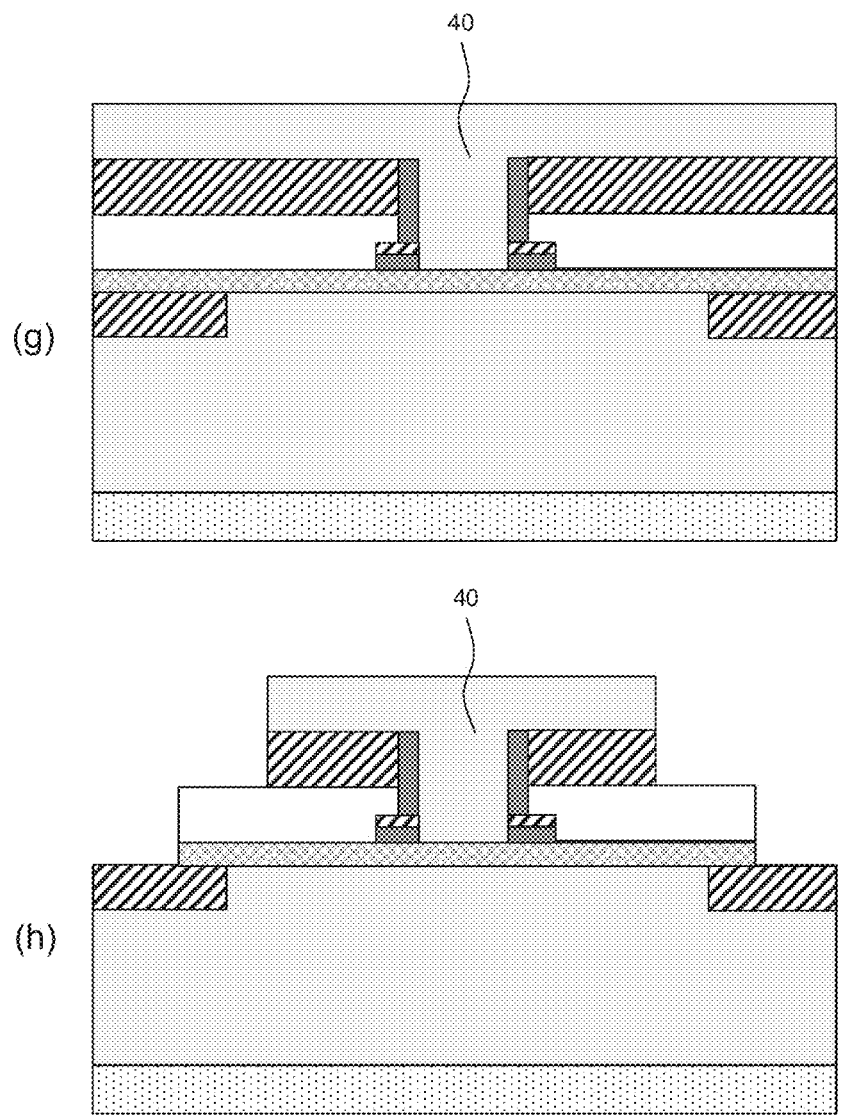
Figure 5:
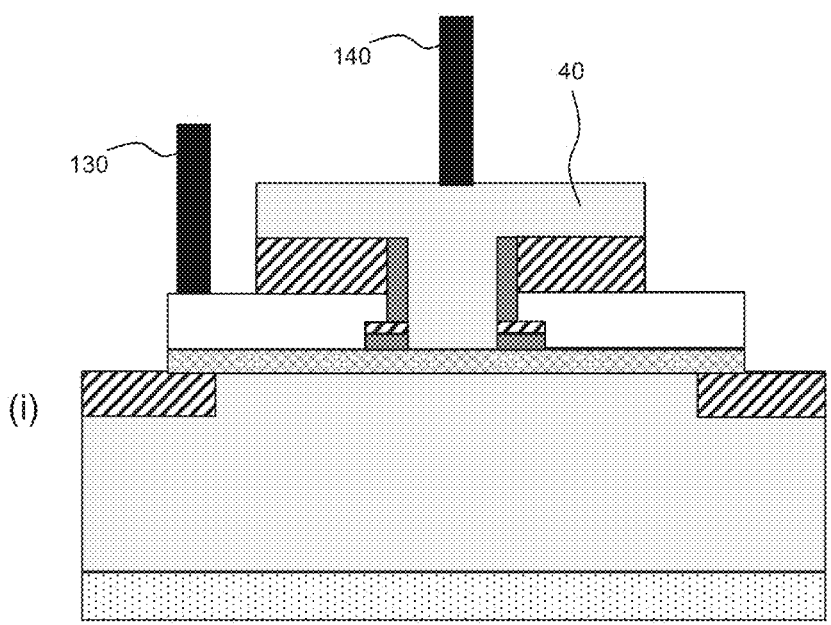

A possible starting point of the method of the present invention is shown in FIG. 5 (a) AND FIG. 6(a). A substrate 10 comprising isolation regions 12 such as shallow trench isolation regions is provided. The isolation regions 12 typically delimit an active region of a bipolar transistor in the substrate 10. In an embodiment, the substrate 10 is an n-type silicon substrate 10, which may for instance be doped with an n-type impurity such as arsenic (As).

The substrate 10 typically comprises a collector region 11, e.g. a relatively lowly-doped collector formed by epitaxial growth or implantation in the substrate 10.

The substrate 10 typically comprises a highly-doped collector region 20, e.g. a buried collector formed by a buried layer grown epitaxially in the substrate 10 or an implanted collector. The highly-doped collector region 20 typically comprises the same impurity type as the collector 11 but at a higher concentration. At least part of the substrate 10 between the highly-doped collector region 20 and the base region 30 on which the emitter is formed as will be explained later defines the collector 11.

The substrate 10 further comprises a collector contact region 22 preferably having a yet higher concentration of the same type of impurity than the highly-doped collector region 20 and the substrate 10 to provide for a reduced series resistance between the top surface of the collector contact region 22 and the highly-doped collector 20. Any suitable implementation of the highly-doped collector 20 and/or the collector contact region 22 may be contemplated. As such implementations are well-known to the skilled person they will not be explained in further detail for reasons of brevity only.

A patterned nitride layer (not shown) optionally may be formed over the isolation regions 12, whilst leaving exposed the active region in between the isolation regions 12. On this structure, a base layer 30 may be epitaxially grown, resulting in monocrystalline base layer portions growing on the exposed regions of a monocrystalline substrate 10 and polycrystalline base layer portions on amorphous or polycrystalline surfaces such as the isolation regions 12 or the nitride layer if present. The base layer 30 typically comprises SiGe doped with a p-type impurity such as boron (B).

In a preferred embodiment, the base layer 30 comprises a Si/SiGe:C layer stack, which by way of non-limiting example may be formed as follows. Prior to the growth of the epitaxial base layer, the exposed silicon surfaces may be passivated by a hydrogen bake. The base layer is formed by first growing an undoped Si buffer layer, followed by the growth of an undoped SiGe:C collector-base spacer, a boron-doped SiGe:C base, an undoped SiGe:C base-emitter spacer and a doped Si emitter cap. The carbon content in the SiGe layers may be selected in the range of 0.1-0.3 atom % and the germanium content may be selected in the range of 15-30 atom % in these layers. The carbon in the SiGe:C layers prevents the outdiffusion of boron impurities from the boron-doped base, as is known per se. However, it should be understood that the exact composition and structure of the base in the bipolar transistor of the present invention is not important; any suitable base construction may be chosen.

After the formation of the base layer, an etch protection layer 32 is formed over the part of the base layer 30 that defines the emitter region to be formed as will be explained in more detail later. The etch protection layer 32 protects the emitter window region of the base layer 30 from etch recipes capable of damaging silicon. Such an etch protection layer may be formed by depositing the layer over the base layer and subsequently patterning the etch protection layer to its desired dimensions, e.g. by forming a patterned mask over the etch protection layer, removing the exposed parts of the etch protection layer and subsequently removing the mask. Such patterning is well-known to the skilled person and has not been explained in further detail for this reason. The etch protection layer preferably comprises a silicon nitride portion 32, as silicon nitride is known to be highly resistant to oxidation enhanced diffusion of the impurities in the base layer 30, e.g. boron impurities.

In an embodiment of the present invention, an oxide portion 34 is formed over the nitride portion 32 to improve the selectivity of the etch protection layer to subsequent silicon etching steps, as will be explained in more detail later. The oxide portion 34 may be formed and patterned in any suitable manner, as previously explained for the silicon nitride portion 32. The oxide portion 34 may be any suitable type of oxide, e.g. $SiO_2$ or TEOS. The nitride layer 32 preferably has a thickness of at least 10 nm, as at this thickness the outdiffusion of the base layer impurities is effectively prevented.

A thin oxide layer may be present between the nitride portion 32 and the base layer 30 to protect the base layer 30 from defect formation by the nitride portion 32 during subsequent elevated temperature steps. In an embodiment, the etch protection layer may be an ONO (oxide-nitride-oxide) stack. The respective thicknesses of the oxide portion 34 and the thin oxide layer if present may be separately optimized. It should be understood that the etch protection portion is not limited to a nitride portion 32 optionally combined with an oxide portion 34. The emitter region on the base layer 30 may be protected using any suitable material.

A polysilicon base contact layer 35 is grown over the resultant structure in any suitable manner, e.g. by means of a suitable vapour deposition process such as CVD, followed by the formation of an electrically insulating layer 60, which may be any suitable dielectric material, e.g. an oxide such as silicon oxide or TEOS.

The method subsequently proceeds to step (b). A further etch resist layer such as a nitride layer (not shown) may be formed over the electrically insulating layer 60 to protect the layer from etch damage during further processing steps. A standard photo resist material (not shown) may be deposited over the nitride layer and patterned to define an emitter window and a field plate trench of the bipolar transistor.

An opening 70 is subsequently etched in the layer stack over the substrate 10, which includes the emitter window 72 terminating on the oxide layer portion 34 and the field plate trench 74 extending into the collector region 11. In an embodiment, the field plate trench 74 terminates in the substrate 10 close to or in the highly-doped collector region 20.

In an embodiment, this etching step is performed using a number of selective etch steps to selectively remove the nitride layer over the electrically insulating layer 60 if present, a selective etch to remove the dielectric or electrically insulating layer 60, e.g. by using a selective oxide etch followed by one or more selective etch steps to remove the polysilicon base contact layer 35, the base layer 30 and the substrate 10 e.g. using a poly-Si or Si etch recipe including $CF_4$, $Cl_2$, HBr and $O_2$. An etch recipe based on $HBr/Cl_2$ is particularly suitable.

It is emphasized that the etching step sequence therefore facilitates the simultaneous formation of the emitter window 72 and the field plate trench 74 without requiring an additional mask to facilitate the inclusion of such a field plate. This absence of such an additional mask makes it possible to pattern the field plates extremely close to the base-collector junction, i.e., extremely close to the region of highest electric field, where the field plates are the most efficient.

Next, spacers 52 and 54 are grown on the exposed vertical surfaces of the opening 70, as shown in step (c). This is known per se and will not be explained in further detail for the sake of brevity only. Any suitable spacer material may be used. In an embodiment, the spacers 52 and 54 are ONO spacers. The first oxide layer prevents that the nitride is in direct contact with silicon, which can create defects during a subsequent high temperature step such as an anneal step. The silicon nitride is included to protect the base from oxidation enhanced diffusion. The final oxide layer protects the nitride from etching during a further etch step. The ONO spacers 52 form the electrical insulation between the collector and the vertical part of the field plates as well as between the field plates and the base layer.

The ONO spacers 54 form an electrical isolation between the emitter and the base contact layer. The spacers may have any suitable shape but preferably have a rectangular shape as this maximizes the electrical insulation. The nitride layer of the spacers preferably has a thickness of at least 10 nm to prevent outdiffusion of boron from the base layer 30 during subsequent elevated temperature steps.

Step (d) is an optional step that is performed when an oxide portion 34 is present on the nitride etch protect portion 32. In this step, the oxide portion 34 is selectively removed by a suitable etch recipe, which will be known per se to the skilled person. If this step is present in the method of the present invention, this will also attack the exposed oxide layer of the ONO spacers 52 and 54. In this case, the exposed oxide layer of the spacers 52 and 54 should be formed to a thickness such that they are only partially removed during this etching step, i.e. the remainder of the oxide layer of the spacers 52 and 54 still provide sufficient electrical insulation between the base contact layer 35 and the emitter to be formed as well as between the field plate and the collector region 11 and the base region 30.

Next, as shown in step (e), the bottom of the field plate trench 74 is lined with an electrically insulating oxide portion 56, which may be formed by a thermal wet oxidation step performed at a temperature in the range of 700-750° C. in which the exposed silicon is oxidized to form silicon oxide. The silicon oxide portion 56 preferably has a thickness of at least 20 nm such that it can withstand a potential difference between the emitter and the collector 11 or the highly-doped collector 20 of 10 V. However, it should be understood that the thickness of the silicon oxide portion 56 may be tuned to the application domain in which the transistor is operable. For instance, if the silicon oxide portion 56 has to withstand higher potential differences its thickness may be increased accordingly, whereas if the silicon oxide portion 56 has to withstand higher potential differences its thickness may be decreased accordingly.

In a preferred embodiment, the silicon substrate 10, the collector region 11 and the highly-doped buried collector 20 comprise As doping. This increases the oxidation speed of the relevant material exposed at the bottom of the field plate trench 74 by a factor 10-100 depending on the level of As doping, e.g. $1*e^{20}$ $cm^{-3}$ or higher, which is a typical doping level of the highly-doped buried collector 20. This limits the duration of the oxidation step, which further limits the outdiffusion of boron from the base layer 30, which outdiffusion is already limited by the presence of the nitride etch protect portion 32 and the nitride sidewall spacers 52 protecting the base layer 30 from exposure to the thermal wet oxidation recipe, especially if the nitride etch protect portion 32 and the nitride sidewall spacers 52 each have a thickness of at least 10 nm.

In step (f), the nitride etch protect portion 32 is removed to expose the emitter region over the base layer 30. This may be done using any suitable nitride etch recipe. If a thin oxide layer is present underneath the nitride etch protect portion 32 this is also removed, e.g. using a separate etch recipe. It is noted that the nitride layer of the spacers 52 and 54 may be protected from being attacked by the presence of an oxide layer over the nitride layer as previously explained. In the absence of such a protective oxide layer the nitride layer of the spacers 52 and 54 must be thick enough such that at the completion of this etching step the nitride layer of the spacers 52 and 54 have been reduced in thickness without removing them altogether.

In step (g), an emitter material is deposited over the resultant structure in any suitable manner, such as an As-doped polysilicon emitter material. This material forms an emitter region 40 and at the same time at least partially fills the field plate trench 74 such that the emitter region 40 is electrically connected to the field plate 50 formed in the field plate trench 74. As such deposition techniques are entirely routine, they are not explained in further detail for the sake of brevity only.

The bipolar device may now be finalized in any suitable manner. For instance, as shown in step (h), the resultant structure may be patterned, e.g. using a sequence of patterning steps such as etching steps to expose the base contact layer 35 and the collector contact 22 after which the collector contact 120, base contact 130 and emitter contact 140 are formed as shown in step (i).

Figure 6:
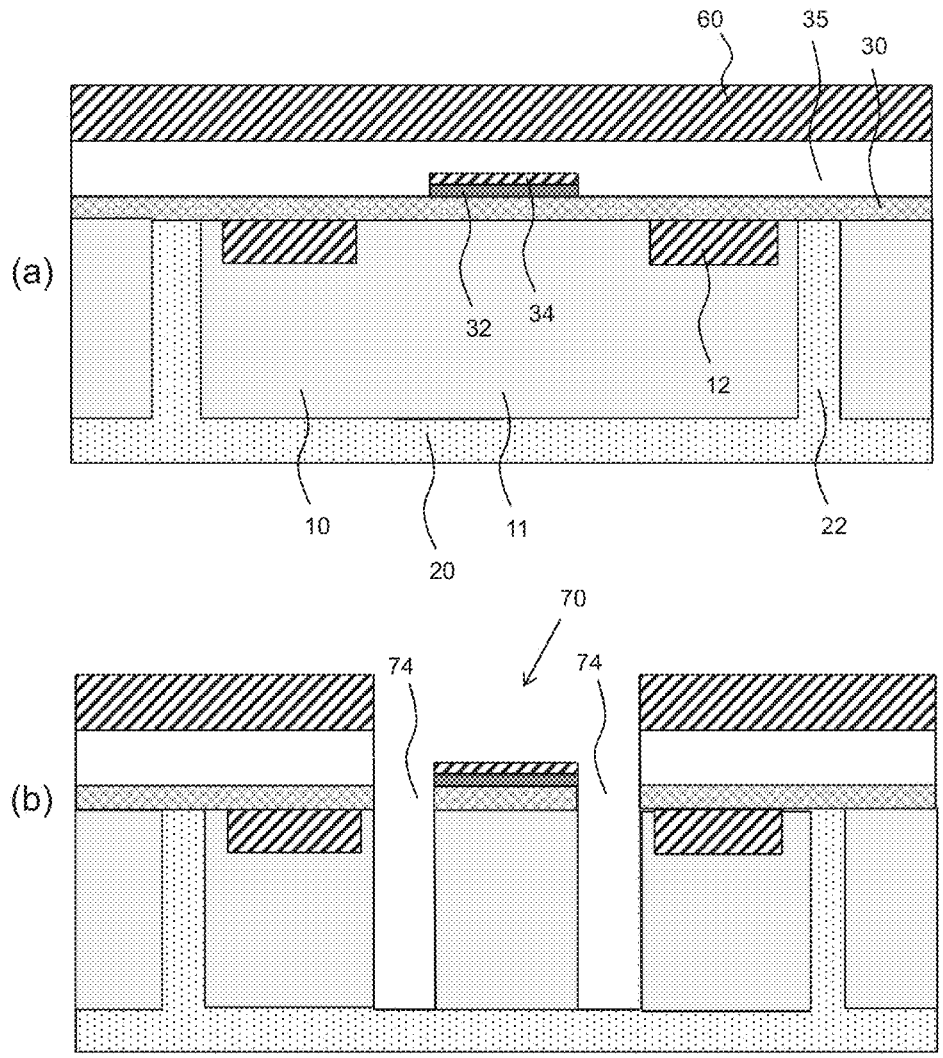
FIG. 6 schematically depicts the various steps of a method of manufacturing a bipolar transistor according to an embodiment of the present invention with views along the y-direction.
Figure 6:
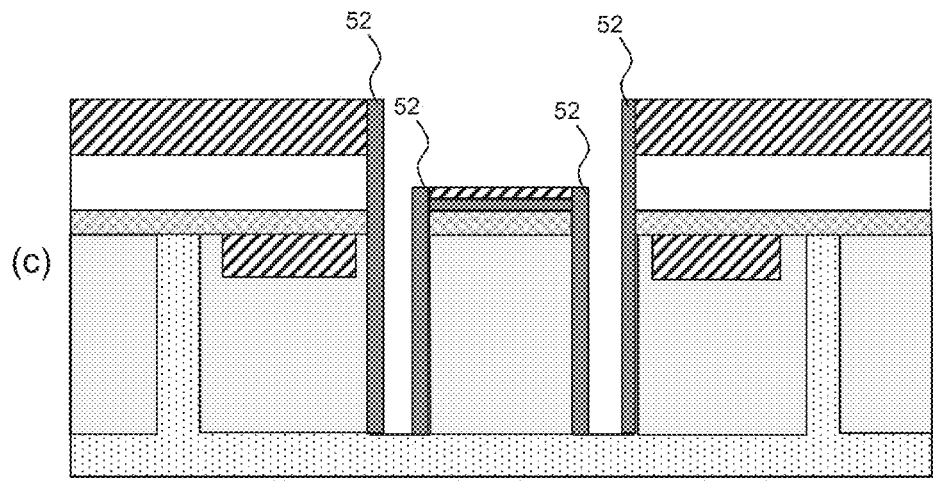
Figure 6:
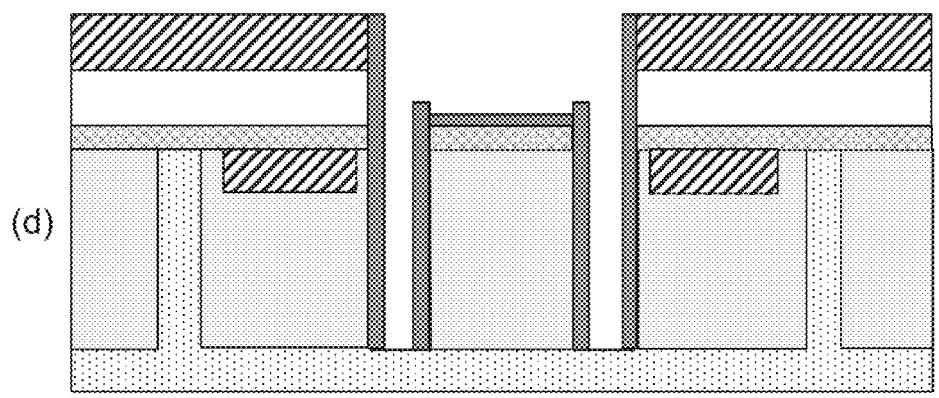
Figure 6:
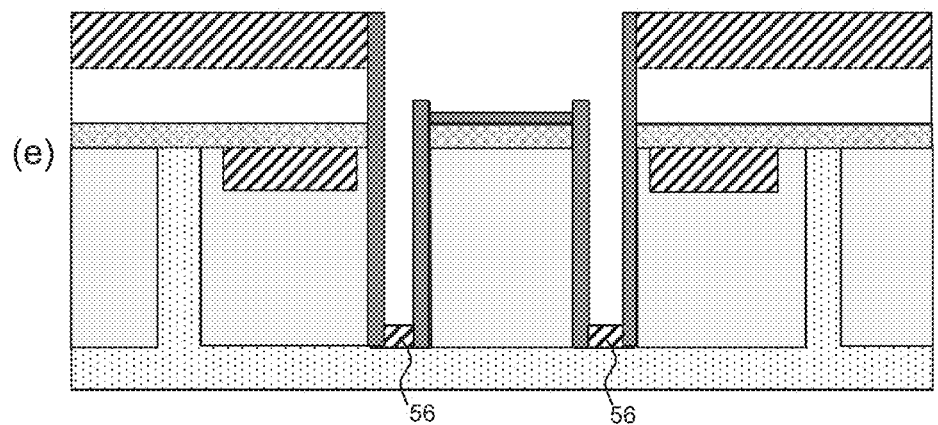
Figure 6:
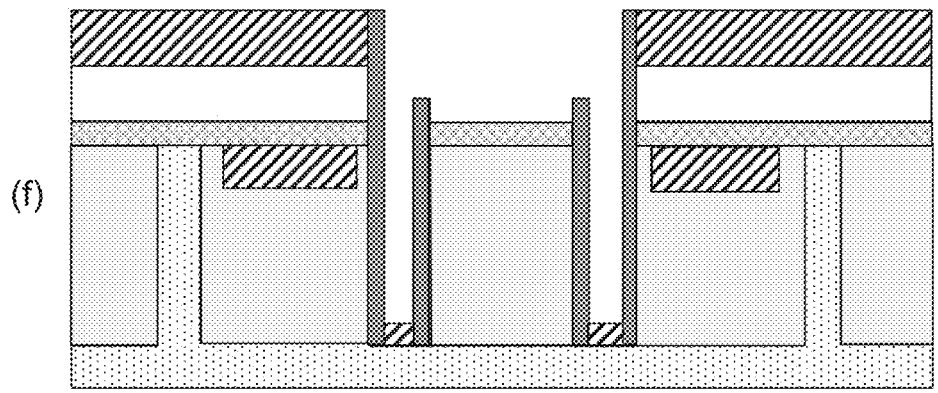
Figure 6:
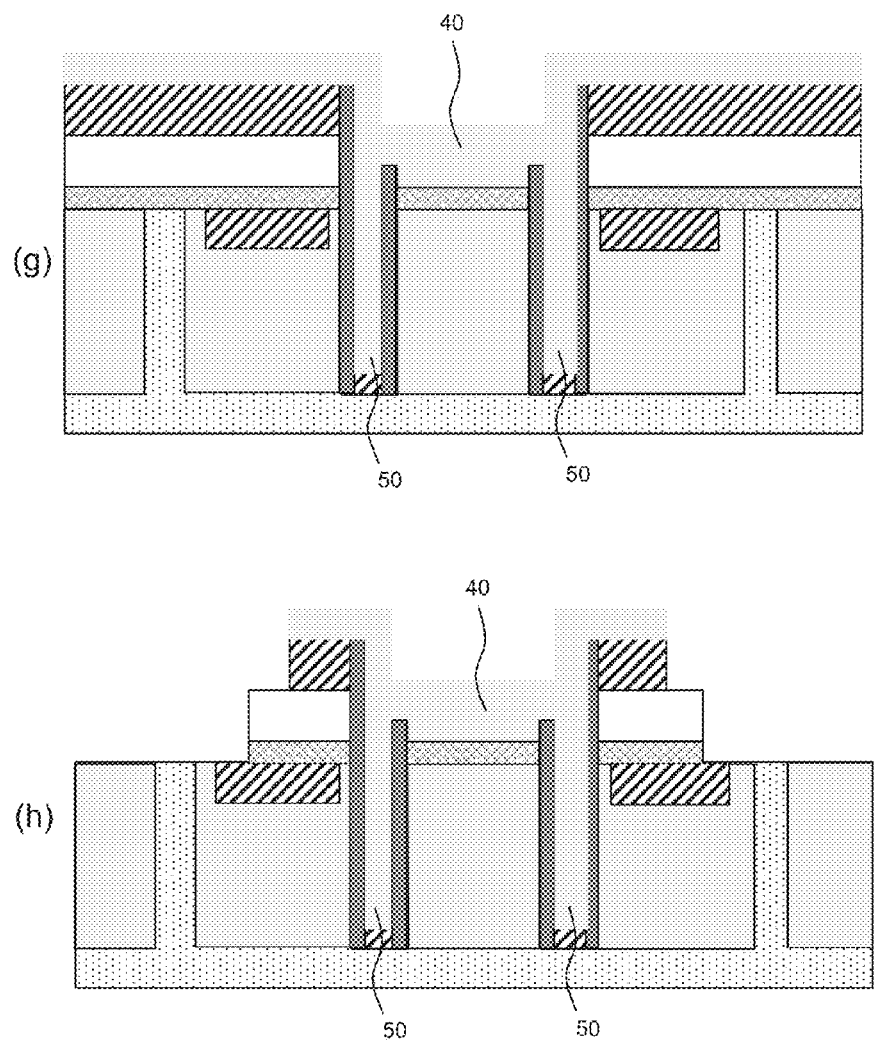
Figure 6:
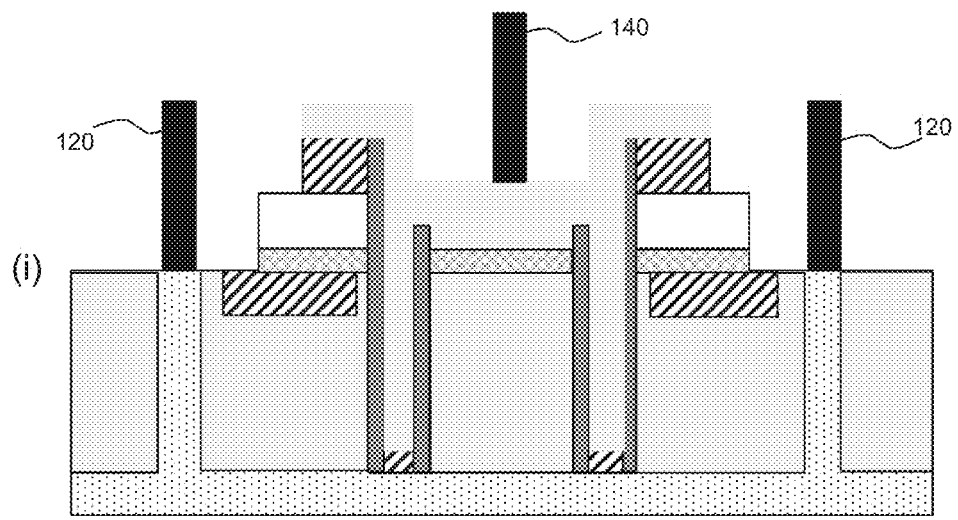
Figure 7:
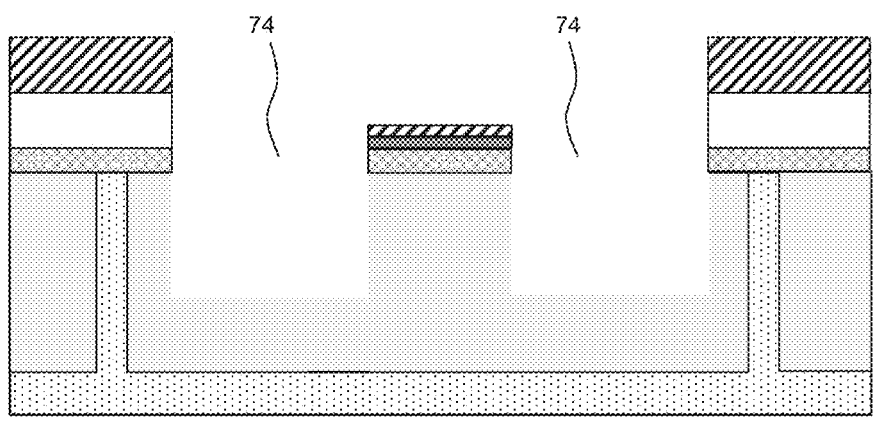
FIG. 7 schematically depicts an aspect of a method of manufacturing a bipolar transistor according to an alternative embodiment of the present invention with a view along the y-direction.

The process flow shown in FIG. 5 AND FIG. 6 yields a heterojunction bipolar transistor having a vertical field plate 50, i.e. a field plate that has a lateral dimension or width that is smaller than the vertical dimension or depth. It should be understood that this is by way of non-limiting example only. It is equally feasible to adjust the shape of the field plate trench shown in FIG. 5 (b) and FIG. 6 (b) as shown in FIG. 7(b) (the view along the x-direction is unaltered), in which a field plate trench 74 is formed that has a lateral dimension or width that is larger than its vertical dimension or depth, thus yielding a horizontal field plate 50 if the device is finished as per the above described further processing steps shown in FIG. 5 AND FIG. 6(c)-(i).

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A bipolar transistor comprising:
   an emitter region vertically separated from a collector region in a substrate by a base region,
   the bipolar transistor further comprising,
   a field plate electrically connected to the emitter region, the field plate extending from the emitter region along the base region into the collector region,
   the field plate being laterally electrically insulated from the base region the collector region by a spacer comprising an electrically isolating material including a silicon nitride layer and vertically electrically isolated from the substrate by a further electrically isolating material; and
   wherein the base region comprises a silicon germanium layer including a boron doping, and wherein the spacer comprises a silicon nitride layer having a thickness of at least 10 nm.

2. The bipolar transistor of claim 1, wherein the further electrically isolating material comprises silicon oxide.

3. The bipolar transistor of claim 1, wherein the spacer further comprises a silicon oxide layer over the base region and the collector region, the silicon nitride layer of the spacer formed on layer over the silicon oxide layer.

4. The bipolar transistor of claim 1, wherein the substrate further comprises a buried collector region such that the collector region is located in between the base region and the buried collector region, wherein the buried collector region has a higher doping level than the collector region.

5. The bipolar transistor of claim 4, wherein the field plate extends into the buried collector region.

6. The bipolar transistor of claim 1, wherein the field plate has a lateral dimension and a vertical dimension, said lateral dimension exceeding said vertical dimension.

7. An integrated circuit comprising at least one bipolar transistor according to claim 1.

8. A method of manufacturing a bipolar transistor, the method comprising:
   providing a semiconductor substrate including a collector;
   forming a base layer on the semiconductor substrate;
   forming an etch protect layer on a portion of the base layer defining an emitter region;
   forming a base contact layer over the etch protect layer and the base layer;
   forming an electrically insulating layer over the base layer;
   etching an opening in the resultant structure formed after the formation of the electrically insulating layer, said opening comprising an emitter window portion exposing at least a part of the etch protect layer and a field plate trench portion adjacent to the emitter window portion extending through the base layer, the base contact layer and part of the substrate;
   lining said opening with an electrically insulating material;
   exposing said emitter region; and
   filling the lined opening with an electrically conductive material.

9. The method of claim 8, wherein the substrate further comprises a buried collector such that the collector is located in between the base region and the buried collector, wherein the buried collector has a higher doping level than the collector; and
   wherein the field plate trench portion extends into the buried collector.

10. The method of claim 8, wherein the field plate trench portion has a lateral dimension and a vertical dimension, said lateral dimension exceeding said vertical dimension.

11. The method of claim 8, wherein the step of forming an etch protect layer on said portion of the base layer comprises:
   forming a silicon nitride etch protect layer on said portion; and forming a silicon oxide sealing layer on the silicon nitride etch protect layer.

12. The method of claim 11, wherein the base layer is a boron-doped silicon germanium containing layer, and wherein said lining step comprises:

forming a layer stack of silicon oxide spacers and a silicon nitride spacers at least on exposed vertical surfaces of the opening;

forming a silicon oxide lining at the bottom of the field plate trench portion.

13. The method of claim 12, wherein the silicon oxide lining is formed by a thermal wet oxidation step.

14. The method of claim 12, further comprising removing the silicon oxide sealing layer prior to forming said silicon oxide lining.

* * * * *